United States Patent
Cho et al.

(10) Patent No.: US 12,037,681 B2
(45) Date of Patent: Jul. 16, 2024

(54) METHOD FOR FORMING CARBON RICH SILICON-CONTAINING FILMS

(71) Applicant: ENTEGRIS, INC., Billerica, MA (US)

(72) Inventors: Sungsil Cho, Anyang-si (KR); Seobong Chang, Suwon (KR); Jae Eon Park, GyeongGi-Do (KR); Bryan C. Hendrix, Danbury, CT (US); Thomas H. Baum, New Fairfield, CT (US)

(73) Assignee: ENTEGRIS, INC., Billerica, MA (US)

( * ) Notice: Subject to any disclaimer, the term of this patent is extended or adjusted under 35 U.S.C. 154(b) by 16 days.

(21) Appl. No.: 17/854,473

(22) Filed: Jun. 30, 2022

(65) Prior Publication Data

US 2022/0364225 A1    Nov. 17, 2022

Related U.S. Application Data (63) Continuation of application No. 16/868,973, filed on May 7, 2020, now Pat. No. 11,414,750.

(60) Provisional application No. 62/844,505, filed on May 7, 2019.

(51) Int. Cl.
| | | |
|---|---|---|
| *C23C 16/36* | (2006.01) | |
| *C23C 16/56* | (2006.01) | |
| *C23C 22/73* | (2006.01) | |
| *H01L 21/02* | (2006.01) | |

(52) U.S. Cl.
CPC .............. *C23C 16/36* (2013.01); *C23C 16/56* (2013.01); *C23C 22/73* (2013.01); *H01L 21/0214* (2013.01); *H01L 21/02263* (2013.01)

(58) Field of Classification Search
CPC ...... H01L 21/0214; C23C 16/36; C23C 16/56
See application file for complete search history.

(56) References Cited

U.S. PATENT DOCUMENTS

| | | | |
|---|---|---|---|
| 2014/0329011 A1* | 11/2014 | Wang | H01L 21/02271 427/255.18 |
| 2015/0194342 A1* | 7/2015 | Cao | H01L 21/76831 438/786 |
| 2020/0090930 A1* | 3/2020 | Hashimoto | C23C 16/45546 |

OTHER PUBLICATIONS

Teshima et al., Room-temperature deposition of high-purity silicon oxide films by RF plasma-enhanced CVD, Surface and Coatings Technology, vol. 146-147, pp. 451-456, 2001.

* cited by examiner

*Primary Examiner* — Austin Murata (57) ABSTRACT

Provided is a method for forming a silicon oxycarbonitride film (SiOCN) with varying proportions of each element, using a disilane precursor under vapor deposition conditions, wherein the percent carbon incorporation into the SiOCN film may be varied between about 5 to about 60%, by utilizing co-reactants chosen from oxygen, ammonia, and nitrous oxide gas. The carbon-enriched SiOCN films thus formed may be converted to pure silicon dioxide films after an etch stop protocol by treatment with $O_2$ plasma.

17 Claims, 6 Drawing Sheets

METHOD FOR FORMING CARBON RICH SILICON-CONTAINING FILMS

CROSS REFERENCE TO RELATED APPLICATIONS

This application is a continuation of U.S. patent application Ser. No. 16/868,973 filed May 7, 2020, which claims the benefit of U.S. Provisional Patent Application No. 62/844,505 filed May 7, 2019, the disclosures of each of which are hereby incorporated herein by reference in their entirety.

FIELD OF THE INVENTION

This invention relates generally to methods for the formation of silicon-containing films in the manufacture of semiconductor devices, and in particular to the formation of silicon-containing films having enhanced levels of carbon incorporated therein.

BACKGROUND OF THE INVENTION

In semiconductor manufacturing, thin (e.g., <1,000 nanometers thickness) passive layers of chemically inert dielectric materials, such as silicon nitride ($Si_3N_4$), siliconoxynitride ($SiO_xN_y$) and/or silicon dioxide ($SiO_2$), are widely employed in microelectronic device structures, to function as structural elements of the multi-layered structure, such as sidewall spacer elements, diffusion masks, oxidation barriers, trench isolation coatings, inter-metallic dielectric materials, passivation layers and etch-stop layers.

Studies have shown that carbon incorporation in silicon nitride films is beneficial to film quality for transistor sidewall spacer applications. Etch stop and capping layers situated between low dielectric constant (low-k) layers also benefit from a mixture of carbon with silicon nitride or silicon oxide. In addition, pre-metal dielectric (PMD)-liners of silicon nitride require etch selectivity and diffusion barrier properties, which can be enhanced by carbon incorporation into the silicon nitride. Silicon oxide has a low etch rate in hot phosphoric acid etches, however, incorporating carbon could significantly enhance that selectivity.

SUMMARY OF THE INVENTION

In summary, the invention provides a method for forming a silicon oxycarbonitride film (SiOCN) with varying proportions of each element, using a disilane precursor under vapor deposition conditions.

The carbon-enriched SiOCN films thus formed may, in an additional aspect, be converted to pure silicon dioxide films after an etch stop protocol by treatment with $O_2$ plasma. The vapor deposition of the SiOCN according to the invention provides films having high wet etch selectivity (70:1) relative to $SiO_2$ film using dilute hydrofluoric acid (dHF) solution and about >1000:1 using $H_3PO_4$ solution. Treatment of the silicon oxycarbonitride film with oxygen plasma affords a highly pure film of pure silicon dioxide film having lower leakage than the SiOCN film and returns the etch rate in (dilute hydrofluoric acid) dHF to levels equal to or greater than that of thermally grown $SiO_2$.

DETAILED DESCRIPTION OF THE INVENTION

Figure 1:
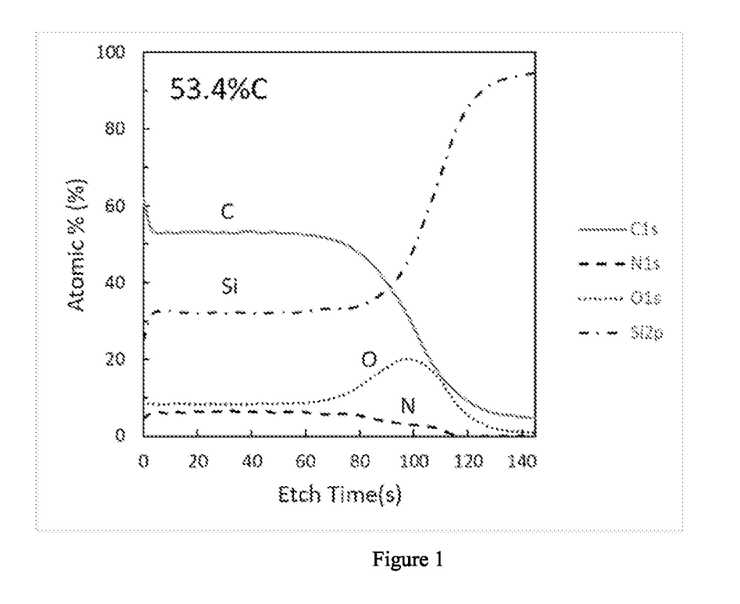
FIG. 1 is a plot of atomic percentage versus etch time in seconds for silicon, carbon, oxygen, and nitrogen in a film formed using the precursor Bis-dimethylhydrazino tetramethyl disilane ("SINCH") at 300 sccm of nitrous oxide in a chemical vapor deposition process. This data illustrates incorporation of carbon into the SiOCN film at a level of about 53.4%.
Figure 2:
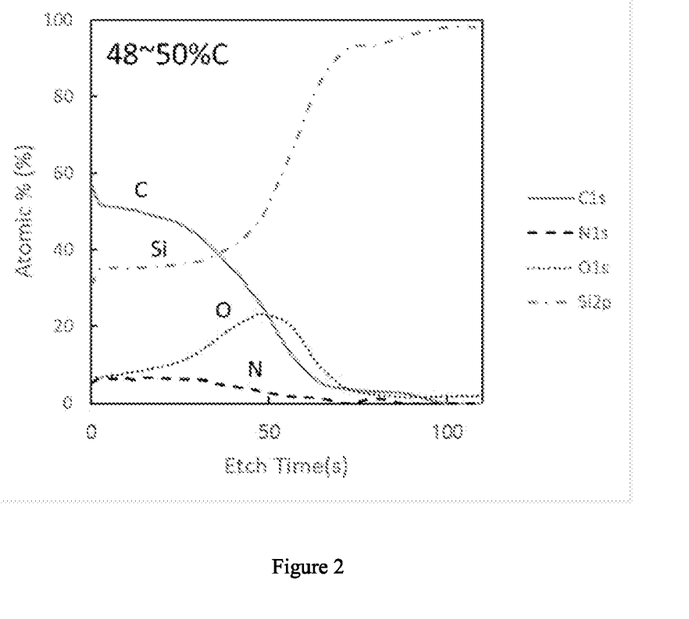
FIG. 2 is a plot of atomic percentage versus etch time in seconds for silicon, carbon, oxygen, and nitrogen in a film formed using the precursor Bis-dimethylhydrazino tetramethyl disilane ("SINCH") at 300 sccm of ammonia in a chemical vapor deposition process. This data illustrates incorporation of carbon into the SiOCN film at a level of about 48-50%.
Figure 3:
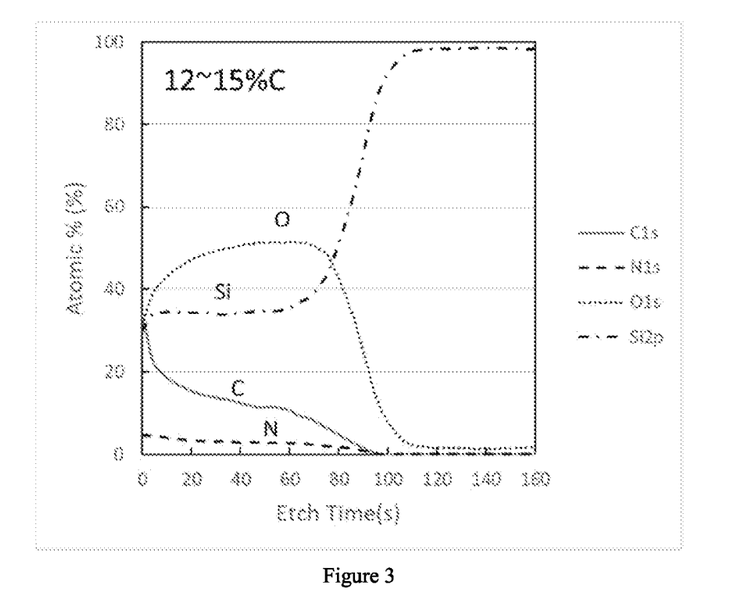
FIG. 3 is a plot of atomic percentage versus etch time in seconds for silicon, carbon, oxygen, and nitrogen in a film formed using the precursor Bis-dimethylhydrazino tetramethyl disilane ("SINCH") at 300 sccm of oxygen in a chemical vapor deposition process. This data illustrates incorporation of carbon into the SiOCN film at a level of about 12-15%.
Figure 4:
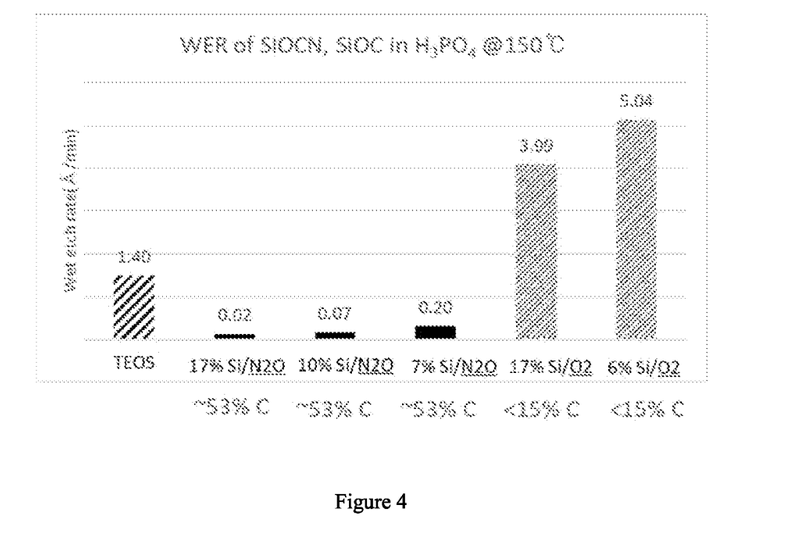
FIG. 4 is a plot of the wet etch rate (WER) of SiOCN film in $H_3PO_4$ at 150°.
Figure 5:
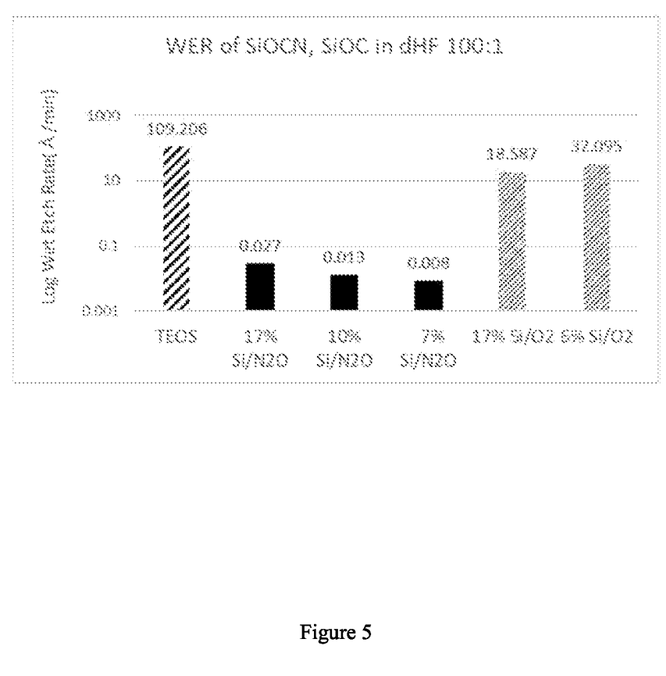
FIG. 5 is a plot of the WER of SiOCN film in dHF (100:1). The data, presented in log format, shows that the increased carbon content of the film is resistant to phosphoric acid and dilute hydrofluoric acid.
Figure 6:
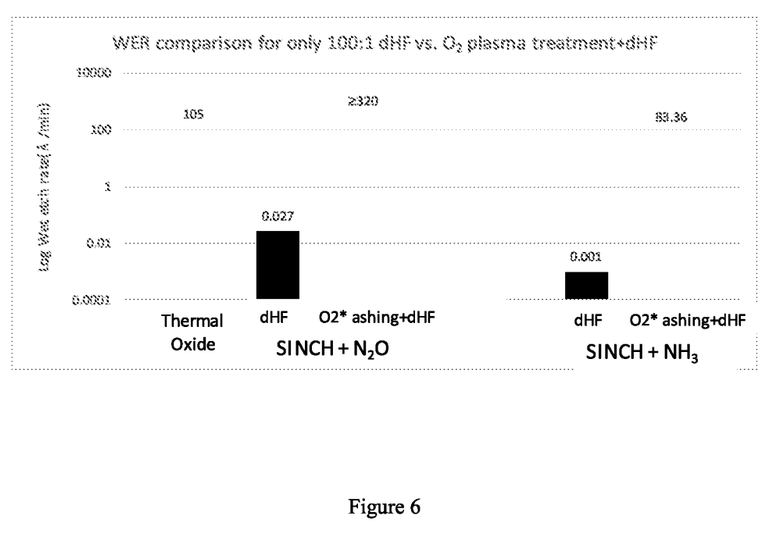
FIG. 6 is a plot of Wet Etch Rate in angstroms per minute comparing a film of the invention before and after $O_2$ plasma treatment, presented in log format.

In a first aspect, the invention provides a method of forming a silicon oxycarbonitride film on a microelectronic device substrate, comprising exposing said substrate to (i) a silicon precursor compound having the Formula (I)

wherein $R_1$, $R_2$, and $R_3$ are independently chosen from hydrogen or $C_1$-$C_6$ alkyl, and each X and each Y, are independently chosen from hydrogen, halo, $C_1$-$C_6$ alkyl, $C_1$-$C_6$ alkylamino, $C_1$-$C_6$ dialkylamino, and $C_1$-$C_6$ alkylhydrazido; and (ii) a co-reactant chosen from ammonia, nitrous oxide and oxygen, under vapor deposition conditions, wherein said silicon oxycarbonitride film possesses a preselected atomic percentage of carbon of from about 5 to about 60%.

In one embodiment, X and Y are chosen from methyl, ethyl, propyl, and halo. In another embodiment, one or more of X and Y are chosen from iodo, chloro, and bromo. In another embodiment, each of X and Y are methyl.

In one embodiment, the compound of Formula (I) is

Compounds of Formula (I) can be prepared by reaction of the corresponding disilane compounds of the formula $(R_1)_2XSi—SiX(R_1)_2$ with a secondary amine of the formula $R_2R_3NH$ and a tertiary amine of the formula $R_1R_2R_3N$. See, for example, U.S. Pat. No. 7,601,860, incorporated herein by reference.

The silicon oxycarbonitride film may also contain varying amounts of hydrogen (H), but this will not be reported as part of the composition. Rather the composition of the films will be reported in atomic percent ("at %") where the sum of the contents of Si, O, C, and N is 100 at %. In the method of the invention, the percent carbon incorporation into the SiOCN film may be varied between about 5 to about 60% by utilizing co-reactants chosen from oxygen, ammonia, and nitrous oxide gas. The co-reactants may be used alone or in any combination or proportion, and may be reacted with the substrate all at once or in sequence, either with or without a purge step in between treatment steps, in each case, after treatment with the compound of Formula (I) as set forth below.

In general, vapor deposition conditions comprise reaction conditions known as chemical vapor deposition, pulse-chemical vapor deposition, and atomic layer deposition. In the case of pulse-chemical vapor deposition, a series of alternating pulses of precursor compound of Formula (I) and co-reactant(s), either with or without an intermediate (inert gas) purge step, can be utilized to build up the film thickness to a desired endpoint.

In certain embodiments, the pulse time (i.e., duration of exposure to the substrate) for the precursor compounds of Formula (I) ranges between about 1 and 10 seconds. When a purge step is utilized, the duration is from about 1 to 4 seconds or 1 to 2 seconds. In other embodiments, the pulse time for the co-reactant ranges from 1 to 60 seconds. In other embodiments, the pulse time for the co-reactant ranges from about 5 to about 10 seconds.

In one embodiment, the vapor deposition conditions comprise a temperature of about 350° C. to about 750° C., and a pressure of about 1 to about 1000 Torr. In another embodiment, the vapor deposition conditions comprise a temperature of about 350° to about 550° C.

The compounds of Formula (I) and the co-reactants can be employed for forming silicon oxycarbonitride films on microelectronic devices by chemical vapor deposition, utilizing process conditions including a deposition temperature of from about 350° to about 550° C. to form films having a thickness of from about 50 angstroms to about 50,000 angstroms.

In the method of the invention, the compound of Formula (I) is reacted with the desired co-reactant in any suitable manner, for example, in a single wafer CVD chamber, or in a furnace containing multiple wafers.

In the method of the invention, it is believed that the choice of co-reactant, sequence of utilization, and the corresponding flow rates and concentrations will allow one to prepare a silicon oxycarbonitride film containing from about 5 to about 60% carbon. In certain embodiments, the atomic percentage of carbon of the resulting film will be from about 40 to about 60% or about 45 to about 55%. In other embodiments, the atomic percentage of carbon of the resulting film will be from about 5 to 10%, 10 to 15%, 15 to 20%, 20 to 25%, 25 to 30%, 30 to 35%, 35 to 40%, 40 to 45%, 45 to 50%, 50 to 55%, and 55 to 60%. In this manner, a pre-selected atomic percentage of carbon can be incorporated into the film by utilizing any of ammonia, nitrous oxide, and oxygen, either individually or in any combination as co-reactant. Additionally, the co-reactant(s) may be utilized all at once in a pre-determined proportion and flow rate to yield a given atomic percentage of carbon, or the co-reactant(s) may be added sequentially, in different orders, and with and without intermediate step(s) of purging the reactor.

In further embodiments, the invention provides a silicon oxycarbonitride film comprising about 40 to about 60 atomic % carbon, about 50 to about 60 atomic % carbon, or about 50 to about 55 atomic percent % carbon. In further embodiments, the invention provides a microelectronic device, having deposited thereon a silicon oxycarbonitride film comprising about 40 to about 60 atomic % carbon, about 50 to about 60 atomic % carbon, or about 50 to about 55 atomic % carbon. Such films will be from about 50 angstroms to about 50,000 angstroms in thickness.

The silicon oxycarbonitride films thus produced can be essentially quantitatively converted to pure silicon dioxide films by exposure of said film to oxygen plasma, typically after an etch stop process. In this regard, the method of the invention is advantageously employed to form pure silicon dioxide films on very high aspect ratio microelectronic devices, having conformities of greater than 95% in a 50:1 aspect ratio microelectronic device. In this context, the films are generally more pure than corresponding silicon dioxide films formed by conventional thermal growth processes. In certain embodiments, the silicon dioxide films thus formed will be at least about 99% pure.

Accordingly, in another aspect, the invention provides a method of forming a silicon dioxide film on a microelectronic device substrate, comprising exposing said substrate to (i) a silicon precursor compound having the Formula (I)

wherein $R_1$, $R_2$, and $R_3$ are independently chosen from hydrogen or $C_1$-$C_6$ alkyl, and each X and each Y, are independently chosen from hydrogen, halo, $C_1$-$C_6$ alkyl, $C_1$-$C_6$ alkylamino, $C_1$-$C_6$ dialkylamino, and $C_1$-$C_6$ alkylhydrazido; and (ii) a co-reactant chosen from ammonia, nitrous oxide and oxygen, under vapor deposition conditions, wherein said silicon oxycarbonitride film possesses a pre-selected atomic percentage of carbon of from about 5 to about 60%, to form a silicon oxycarbonitride film, followed by treatment of said silicon oxycarbonitride film with oxygen plasma, to afford said silicon dioxide film.

In further embodiment, the invention provides a silicon dioxide film which is at least about 99% pure. In a further embodiment, the invention provides a microelectronic device having deposited thereon a silicon dioxide film which is at least about 99% pure. Such films will be from about 50 angstroms to about 50,000 angstroms in thickness.

This invention can be further illustrated by the following examples of certain embodiments thereof, although it will be understood that these examples are included merely for purposes of illustration and are not intended to limit the scope of the invention unless otherwise specifically indicated.

EXPERIMENTAL SECTION

Example 1. Silicon Oxycarbonitride with 53% C

A warm-walled ALD reactor was used to deposit a silicon oxycarbonitride film onto a silicon (100) wafer surface which was controlled at 550° C. and the pressure was controlled at 1-2 Torr with a continuous flow of Ar inert gas. A series of alternating precursor and co-reactant pulses was used to build up the film thickness. A bubbler of SiNCH was held at a temperature of 80° C. Ar carrier gas flowed through the bubbler at 50 sccm carrying SiNCH vapor to the substrate surface for a pulse time of 10 s. This was followed by a 20 s pulse of 200 sccm Ar. This was followed by a 5 s pulse of 300 sccm of $N_2O$ which was followed by another 20 s Ar purge. This pulse sequence was repeated 450 times to give a film thickness of 300 Å with a composition shown as in the first line of the table.

Example 2. Silicon Oxycarbonitride with ~48% C

A warm-walled ALD reactor was used to deposit a silicon oxycarbonitride film onto a silicon (100) wafer surface which was controlled at 550° C. and the pressure was controlled at 1-2 Torr with a continuous flow of Ar inert gas. A series of alternating precursor and co-reactant pulses was used to build up the film thickness. A bubbler of SiNCH was held at a temperature of 80° C. Ar carrier gas flowed through the bubbler at 50 sccm carrying SiNCH vapor to the substrate surface for a pulse time of 8 s. This was followed by a 20 s pulse of 200 sccm Ar. This was followed by a 10 s pulse of 300 sccm of $NH_3$ which was followed by another 20 s Ar purge. This pulse sequence was repeated 450 times to give a film thickness of 170 Å with a composition shown as in the second line of the table.

Example 3. Silicon Oxycarbonitride with ~15% C

A warm-walled ALD reactor was used to deposit a silicon oxycarbonitride film onto a silicon (100) wafer surface which was controlled at 550° C. and the pressure was controlled at 1-2 Torr with a continuous flow of Ar inert gas. A series of alternating precursor and co-reactant pulses was used to build up the film thickness. A bubbler of SiNCH was held at a temperature of 60° C. Ar carrier gas flowed through the bubbler at 50 sccm carrying SiNCH vapor to the substrate surface for a pulse time of 10 s. This was followed by a 20 s pulse of 200 sccm Ar. This was followed by a 10 s pulse of 300 sccm of $O_2$ which was followed by another 20 s Ar purge. This pulse sequence was repeated 450 times to give a film thickness of 270 Å with a composition shown as in the last line of the table.

| Process Conditions XPS Result | | | | | | | |
|---|---|---|---|---|---|---|---|
| SINCH* bubbler temp | Reactant (sccm) | | | Growth Rate | | | |
| (° C.) | $N_2O$ | $O_2$ | $NH_3$ | (Å/cycle) | C | N | O |
| 60–90 | 300~700 | — | — | 0.6~0.74 | 51.9~53.7 | 4.3~6.4 | 8.2~8.8 |
| 80 | — | — | 300 | 0.57 | 48~50 | 6.5 | 8.7 |
| 60 | — | 300~900 | — | 0.6~0.77 | 12~15 | 2.7~3.1 | 48.0~50.6 |

*SINCH = Bis-dimethylhydrazino tetramethyl disilane

| Typical Process condition | | | | | | |
|---|---|---|---|---|---|---|
| Process Chamber | | SINCH* bubbler temp (° C.) | SINCH* Carrier gas (He or Ar or N2) | Reactant | | |
| Process temperature (° C.) | Process Pressure (Torr) | | | $N_2O$ (sccm) | $O_2$ (sccm) | $NH_3$ (sccm) |
| 350~650 | 0.01~100 | 25~120 | 0~1000 | 0~1000 | 0~1000 | 0~1000 |

| XPS result of before/after $O_2$ plasma treatment Process Conditions XPS Result | | | | | | | | |
|---|---|---|---|---|---|---|---|---|
| SINCH* bubbler temp | Reactant (sccm) | | | Growth Rate | O2 plasma | Atomic % | | |
| (° C.) | $N_2O$ | $O_2$ | $NH_3$ | (Å/cycle) | treatment | C | N | O |
| 80 | 300 | | | 0.6 | Before | 53.4 | 5.5 | 8.6 |
| | | | | | After | 0 | 0 | 67.5 |
| 80 | | | 300 | 0.57 | Before | 48–50 | 6.5 | 8.7 |
| | | | | | After | 0 | 0 | 67.6 |

The invention has been described in detail with particular reference to certain embodiments thereof, but it will be understood that variations and modifications can be affected within the spirit and scope of the invention.

What is claimed is:

1. A method of forming a silicon oxycarbonitride film on a microelectronic device substrate, comprising exposing said substrate to
   (i) a silicon precursor compound having the Formula (I)

wherein $R_1$, $R_2$, and $R_3$ are independently chosen from hydrogen or $C_1$-$C_6$ alkyl, and each X and each Y, are independently chosen from hydrogen, halogen, $C_1$-$C_6$ alkyl, $C_1$-$C_6$ alkylamino, $C_1$-$C_6$ dialkylamino, and $C_1$-$C_6$ alkylhydrazido;
   (ii) a co-reactant chosen from ammonia and nitrous oxide, under vapor deposition conditions, wherein said silicon oxycarbonitride film possesses a pre-selected atomic percentage of carbon of from 55% to 60%;
   exposing the substrate to an etch such that the silicon oxycarbonitride film acts as an etch stop; and
   converting the silicon oxycarbonitride film into a silicon oxide film using an oxygen plasma.

2. The method of claim 1, wherein X and Y are chosen from halogen, methyl, and propyl.

3. The method of claim 1, wherein the compound of Formula (I) is

4. The method of claim 1, wherein the co-reactant comprises nitrous oxide.

5. The method of claim 1, wherein the co-reactant comprises any combination of at least two of oxygen, ammonia, and nitrous oxide.

6. The method of claim 1, wherein the co-reactant comprises a mixture of oxygen, ammonia, and nitrous oxide.

7. The method of claim 1, wherein X is halogen.

8. The method of claim 1, wherein X is propyl.

9. The method of claim 1, wherein X differs from Y.

10. The method of claim 1, wherein $R_1$ and $R_2$ are the same.

11. A method of forming a silicon oxide film comprising:
    forming a silicon oxycarbonitride film on a substrate;
    using the silicon oxycarbonitride film as an etch stop; and
    converting the silicon oxycarbonitride film into a silicon oxide film using an oxygen plasma.

12. The method of claim 11, wherein forming the silicon oxycarbonitride film comprises contacting the substrate with a precursor having the Formula (I)

wherein $R_1$, $R_2$, and $R_3$ are independently chosen from hydrogen or $C_1$-$C_6$ alkyl, and each X and each Y, are independently chosen from hydrogen, halogen, $C_1$-$C_6$ alkyl, $C_1$-$C_6$ alkylamino, $C_1$-$C_6$ dialkylamino, and $C_1$-$C_6$ alkylhydrazido.

13. The method of claim 11, further comprising performing an acid etch using hydrofluoric acid (dHF).

14. The method of claim 11, further comprising performing an acid etch using phosphoric acid.

15. The method of claim 11, wherein the silicon oxide film is greater than 99 atomic % silicon and oxygen.

16. A method of producing multiple types of coatings using a shared precursor comprising:
    forming a less than 20 atomic % carbon silicon oxycarbonitride film using a precursor of Formula (i)

wherein $R_1$, $R_2$, and $R_3$ are independently chosen from hydrogen or $C_1$-$C_6$ alkyl, and each X and each Y, are independently chosen from hydrogen, halogen, $C_1$-$C_6$ alkyl, $C_1$-$C_6$ alkylamino, $C_1$-$C_6$ dialkylamino, and $C_1$-$C_6$ alkylhydrazido with an oxygen-containing coreactant;
    forming a greater than 50 atomic % carbon silicon oxycarbonitride film using the same precursor with a nitrogen-containing coreactant, and
    converting the silicon oxycarbonitride films into silicon oxide using an oxygen plasma.

17. The method of claim 16, further comprising treating the less than 20 atomic % carbon silicon oxycarbonitride film and the greater than 50 atomic % carbon silicon oxycarbonitride film with an acid etch.

* * * * *